(12) United States Patent
Kolokowsky

(10) Patent No.: US 7,853,749 B2
(45) Date of Patent: Dec. 14, 2010

(54) FLASH DRIVE FAST WEAR LEVELING

(75) Inventor: Steve Kolokowsky, San Diego, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 147 days.

(21) Appl. No.: 11/468,569

(22) Filed: Aug. 30, 2006

(65) Prior Publication Data

US 2007/0050536 A1 Mar. 1, 2007

Related U.S. Application Data

(60) Provisional application No. 60/713,913, filed on Sep. 1, 2005.

(51) Int. Cl.
*G06F 12/00* (2006.01)
(52) U.S. Cl. .................... 711/103; 711/156; 365/218
(58) Field of Classification Search ................ 711/103
See application file for complete search history.

(56) References Cited

U.S. PATENT DOCUMENTS

| | | | | |
|---|---|---|---|---|
| 5,568,423 A | * | 10/1996 | Jou et al. | 365/185.33 |
| 6,263,399 B1 | * | 7/2001 | Hwang | 711/103 |
| 7,032,087 B1 | * | 4/2006 | Chang et al. | 711/156 |
| 2004/0210706 A1 | * | 10/2004 | In et al. | 711/103 |
| 2006/0106972 A1 | * | 5/2006 | Gorobets et al. | 711/103 |

OTHER PUBLICATIONS

International Search Report for International Application No. PCTUS06/34243 mailed Nov. 6, 2007; 2 pages.
The Written Opinion for the International Searching Authority for International Application No. PCTUS06/34243 mailed Nov. 6, 2007; 8 pages.

\* cited by examiner

*Primary Examiner*—Kevin L Ellis
*Assistant Examiner*—Matthew Bradley

(57) ABSTRACT

A system and method comprising a non-volatile memory including one or more memory blocks to store data, a controller to allocate one or more of the memory blocks to store data, and a wear-leveling table populated with pointers to unallocated memory blocks in the non-volatile memory, the controller to identify one or more pointers in the wear-leveling table and to allocate the unallocated memory blocks associated with the identified pointers for the storage of data.

10 Claims, 4 Drawing Sheets

FLASH DRIVE FAST WEAR LEVELING

REFERENCE TO RELATED APPLICATIONS

This application claims priority from U.S. Provisional Application No. 60/713,913, filed Sep. 1, 2005, which is incorporated herein by reference.

FIELD OF THE INVENTION

This invention relates generally to memory devices, and more specifically to improved wear leveling of flash memory.

BACKGROUND OF THE INVENTION

Non-volatile memory devices, such as flash memory, are widely used in data storage applications. Although the physical characteristics of flash memory allow for non-volatile data storage, flash memory has the disadvantage of having a finite lifespan. For instance, NAND flash memory blocks typically wear out or fail after undergoing approximately 100,000 to 1,000,000 write operations.

A flash driver typically performs memory operations, e.g., read, write, and erase operations, on memory blocks. During write operations the flash driver is commonly required to identify erased memory blocks available to store data. Many flash drivers perform these write operations on the most recently erased memory block. Although this method efficiently locates erased memory blocks for performing write operations, it does not always evenly distribute write operations among the memory blocks and thus decreases the life of the flash memory.

To maximize the lifespan of flash memory, many systems implement wear-leveling techniques that attempt to more evenly appropriate write operations over the memory blocks. For instance, flash drivers may increase wear-leveling by linearly searching a logical-to-physical table that provides pointers to all of the memory blocks in flash memory. There are typically flags accompanying the pointers in the logical-to-physical table, for example, an erase flag to indicate that the memory block corresponding to the pointer is erased and a bad block flag to indicate that the memory block has failed.

Although this wear-leveling technique may increase the lifespan of the flash memory by distributing the write operations, the linear search of the logical-to-physical table used to find the next erased block to write data is inefficient and, in some circumstances, impossible to perform given the processing requirements of the flash driver. For instance, a flash driver performing a linear search on a logical-to-physical table having 1024 memory blocks with 24 available and erased memory blocks, requires an average of 44 accesses to the logical-to-physical table to find an erased memory block, with a worst-case scenario of 1000 accesses to the logical-to-physical table. When the flash memory includes 10 bad memory blocks and only 14 erased memory blocks, the flash driver will have to access the logical-to-physical table an average of 77 times to find an erased block.

DESCRIPTION OF THE DRAWINGS

The invention may be best understood by reading the disclosure with reference to the drawings.

DETAILED DESCRIPTION

Figure 1:
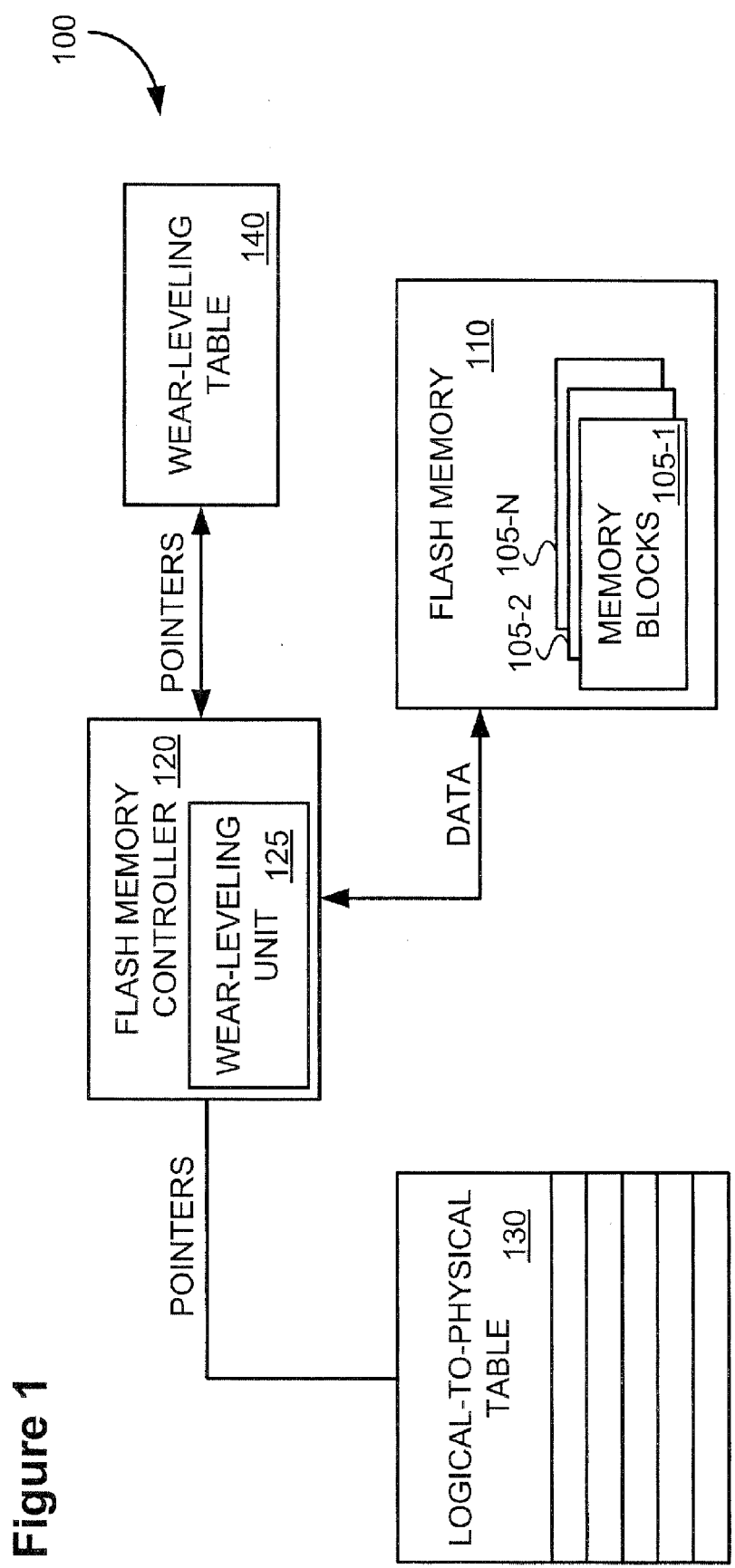
FIG. 1 illustrates, in block form, a memory system useful with embodiments of the present invention.

FIG. 1 illustrates, in block form, a memory system 100 useful with embodiments of the present invention. Referring to FIG. 1, the memory system 100 includes a flash memory 110 having a plurality of memory blocks 105-1 to 105-N to store data. In some embodiments, the flash memory 110 may include 1024 memory blocks configured according to a SmartMedia™ specification, for example, with a maximum of 1000 of the 1024 memory blocks allocated for the storage of data at any given time. The remaining unallocated memory blocks may include erased or erasable memory blocks available to store data, bad or faulty memory blocks, or both. The flash memory 110 may be NAND flash memory, or any other type of non-volatile memory capable of storing data.

The memory system 100 includes a flash memory controller 120 to perform memory access operations, such as read, write, and erase operations, on memory blocks 105-1 to 105-N of the flash memory 110. When prompted to write data to the flash memory 110, the flash memory controller 120 may identify one or more unallocated memory blocks in the flash memory 110 available to store the data and then write the data to the identified memory block(s). The flash memory controller 120 may be implemented as firmware, a processor or multiple communicating processors executing instruction stored in a computer-readable medium, a set of discrete hardware components, or the like.

The memory system 100 includes a logical-to-physical table 130 populated with pointers to the memory blocks 105-1 to 105-N in the flash memory 110. The pointers may be addresses to physical locations of memory blocks 105-1 to 105-N in the flash memory 110. The logical-to-physical table 130 may be located in a redundant area of the flash memory and/or stored in another memory, e.g., a random access memory (RAM) or the like, included in the memory system 100.

During an initial configuration of the memory system 100, the flash memory controller 120 may initialize the pointers in the logical-to-physical table 130, for example, in a 1:1 configuration with the memory blocks 105-1 to 105-N in the flash memory 110. In some embodiments, the 1:1 mapping to the memory blocks 105-1 to 105-N may be performed during manufacturing or during an initial use of the memory system 100. Thus, when initially writing data to the flash memory 110, the flash memory controller 120 may identify memory blocks 105-1 to 105-N to store data by linearly sequencing through the logical-to-physical table 130.

After the initialization of the logical-to-physical table 130 or when the flash memory controller 120 completes the linear sequencing through the logical-to-physical table 130, the flash memory controller 120 identifies pointers to erased or erasable memory blocks in the flash memory 110 during data write operations. Since searching the logical-to-physical table 130 may be an inefficient and onerous task for the flash memory controller 120, embodiments of the memory system 100 include a wear-leveling table 140 populated with pointers to unallocated memory blocks in the flash memory 110. The unallocated memory blocks may be memory blocks 105-1 to 105-N available to store data, such as memory blocks that the flash memory controller 120 has previously erased, or may be memory blocks 105-1 to 105-N that have failed or that are faulty. The wear-leveling table 140 may be located in a redundant area of the flash memory and/or stored in another memory, e.g., a random access memory (RAM) or the like, included in the memory system 100.

The flash memory controller 120 includes a wear-leveling unit 125 to populate the wear-leveling table 140 with the pointers to the unallocated memory blocks. In some embodiments, the wear-leveling unit 125 populates the wear-leveling table 140 with pointers to the unallocated memory blocks after the or concurrently to initialization the logical-to-physical table 130, and/or after or concurrently with the flash memory controller 130 storing data to memory blocks 105-1 to 105-N corresponding to the initialized pointers in the logical-to-physical table 130.

When the flash memory controller 120 determines to write data to the flash memory 110, the wear-leveling unit 125 may access the wear-leveling table 140 to identify at least one erased or erasable memory block in the flash memory 110 available to store the data. The wear-leveling table 140 may also include data to indicate which of the pointers correspond to erased or erasable memory blocks and which of the pointers correspond to faulty or failed memory blocks. Since the wear-leveling table 140 includes pointers to unallocated memory blocks in the flash memory 110, the wear-leveling unit 125 may reduce the time required to identify an erased or erasable memory block during data write operations.

The wear-leveling unit 125 may implement a prioritization scheme that prioritizes the wear-leveling table 140, for example, during the population of the wear-leveling table 140. The wear-leveling unit 125 may prioritize the unallocated memory blocks, or the erased or erasable memory blocks, according to the number of write operations each memory block has undergone or according to when the memory blocks were erased or deemed erasable. The prioritization of the wear-leveling table 140 may allow the wear-leveling unit 125 to linearly access pointers to erased or erasable memory blocks according to their priority, thus allowing the memory system 100 to more evenly distribute write operations among the memory blocks 105-1 to 105-N and helping to elongate the life of the flash memory 110.

Figure 2:
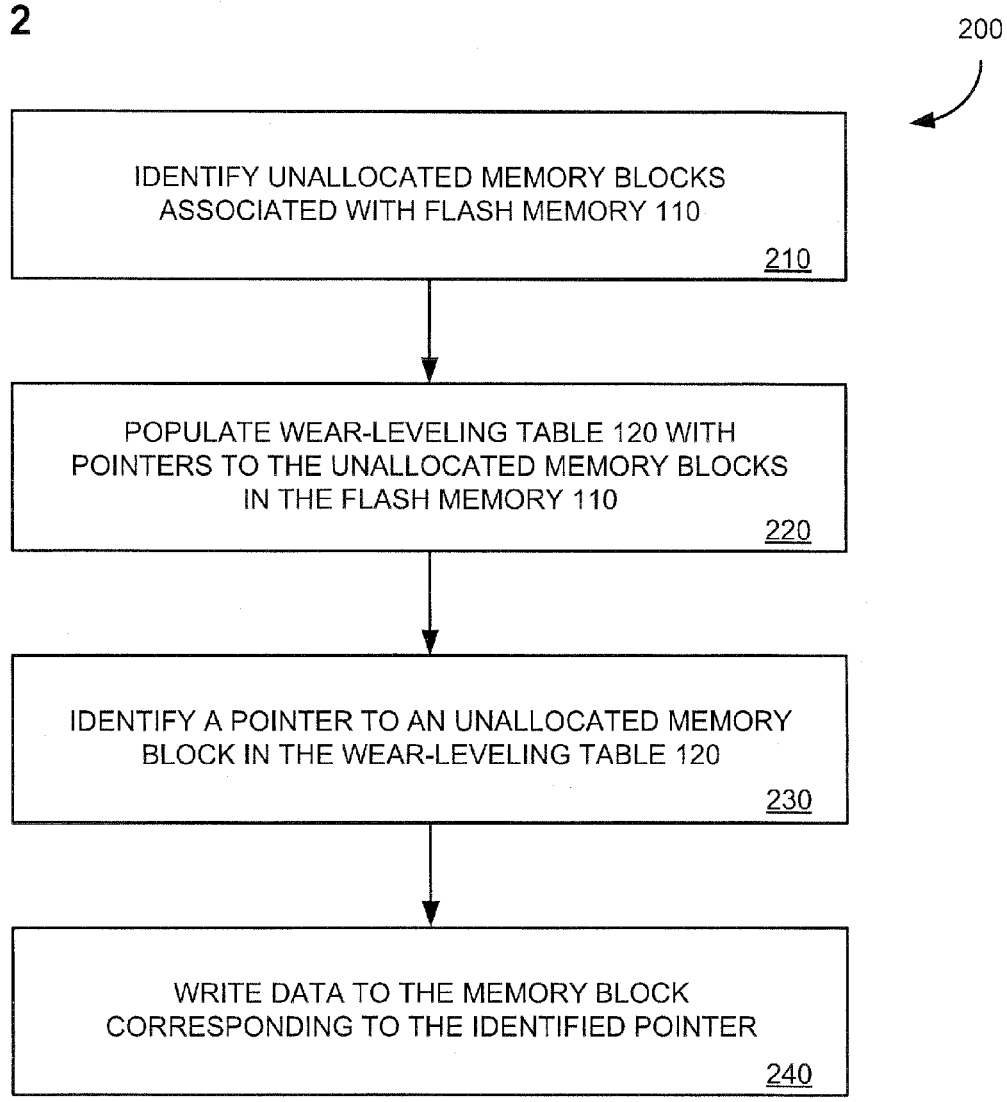
FIG. 2 shows a flowchart illustrating example operations of the memory system shown in FIG. 1.

FIG. 2 shows a flowchart 200 illustrating example operations of the memory system shown in FIG. 1. Referring to FIG. 2, in a block 210, the flash memory controller 120 identifies unallocated memory blocks in the flash memory 110. In some embodiments, the flash memory controller 120 may identify the unallocated memory blocks in the flash memory 110 responsive to a determination that one or more memory blocks 105-1 to 105-N in the flash memory 110 no longer need to store data, and either erases the memory block or deems it erasable. The flash memory controller 120 may also identify unallocated memory blocks responsive to a determination that a memory block 105-1 to 105-N in the flash memory 110 is faulty or has failed.

In a block 220, the flash memory controller 120 populates a wear-leveling table 140 with pointers to the unallocated memory blocks in the flash memory. In some embodiments, the wear-leveling unit 125 populates the wear-leveling table 140 with the pointers. The wear-leveling table 140 may include pointers to erased or erasable memory blocks in the flash memory 110, or to faulty or failed memory blocks in the flash memory 110.

The flash memory controller 120 may implement a prioritization scheme that prioritizes the wear-leveling table 140, for example, during the population of the wear-leveling table 140. The flash memory controller 120 may prioritize the unallocated memory blocks or the erased or erasable memory blocks, according to the number of write operations each memory block has undergone, or according to when the memory blocks were erased or deemed erasable.

In a block 230, the flash memory controller 120 identifies a pointer to an unallocated memory block in the wear-leveling table 140, the unallocated memory block available to store data from the flash memory controller 120. The identified pointer may be to an unallocated memory block available to store data, such as an erased memory block or an erasable memory block. When the memory block is erasable, the flash memory controller 120 may erase the memory block prior to writing the data to the memory block.

The flash memory controller 120 may identify the pointer to an unallocated memory block by accessing the wear-leveling table 140 for pointers to erased or erasable memory blocks in the flash memory 110. When the wear-leveling table 140 is prioritized by the flash memory controller 120, the wear-leveling unit 125 may linearly access pointers to erased or erasable memory blocks, thus reducing search time and allowing the memory system 100 to more evenly distribute write operations among the memory blocks 105-1 to 105-N.

In a next block 240, the flash memory controller 120 writes data to the memory block corresponding to the identified pointer. In some embodiments, the flash memory controller 120 may erase the memory block corresponding to the identified pointer prior to writing data to the memory block.

Figure 3:
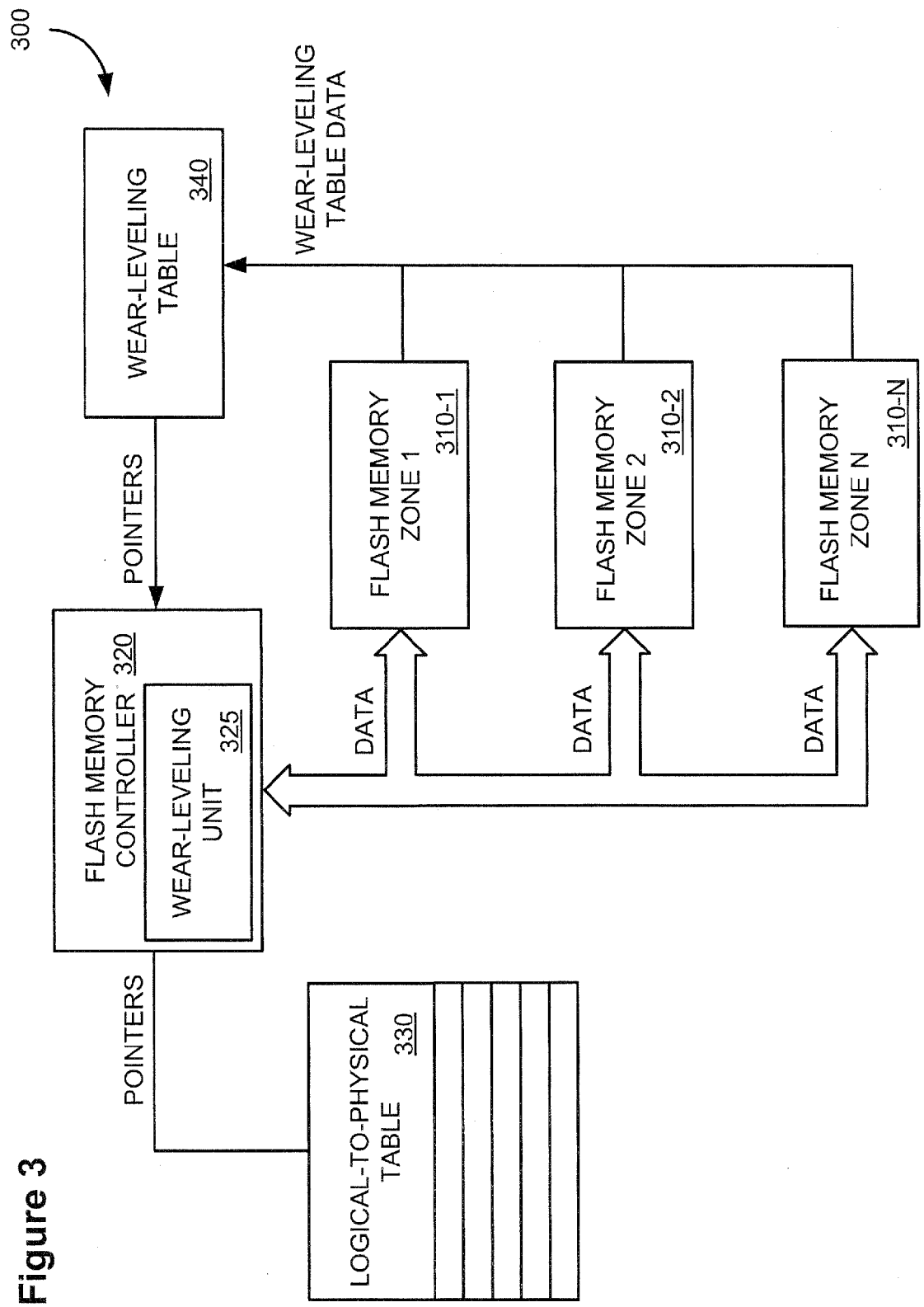
FIG. 3 illustrates, in block form, another memory system useful with embodiments of the present invention.

FIG. 3 illustrates, in block form, another memory system 300 useful with embodiments of the present invention. Referring to FIG. 3, the memory system 300 includes a plurality of flash memory zones 310-1 to 310-N to store data from a flash memory controller 330. In some embodiments, each flash memory zone 310-1 to 310-N may include 1024 memory blocks configured according to a SmartMedia™ specification, for example, with a maximum of 1000 of the 1024 memory blocks allocated for the storage of data at any given time. The remaining unallocated memory blocks may include erased or erasable memory blocks available to store data, bad or faulty memory blocks, or both. The flash memory zones 310-1 to 310-N may be NAND flash memory, or any other type of non-volatile memory capable of storing data.

The memory system 300 includes a flash memory controller 320 to perform memory access operations, such as read, write, and erase operations, on the flash memory zones 310-1 to 310-N. When prompted to write data to one of the flash memory zones 310-1 to 310-N, the flash memory controller 120 may identify one or more unallocated memory blocks associated with a flash memory zone 310 available to store the data and then write the data to the identified memory block(s). The flash memory controller 320 may be implemented as firmware, a processor or multiple communicating processors executing instruction stored in a computer-readable medium, a set of discrete hardware components, or the like.

The memory system 300 includes a logical-to-physical table 330 populated with pointers to the memory blocks in one or more of the flash memory zones 310-1 to 310-N. The pointers may be addresses to physical locations of memory blocks in the flash memory zones 310-1 to 310-N. The logical-to-physical table 330 may be located in a redundant area of the flash memory and/or stored in another memory, e.g., a random access memory (RAM) or the like, included in the memory system 300.

During an initial configuration of the memory system 300, the flash memory controller 320 may initialize the pointers in the logical-to-physical table 330, for example, in a 1:1 configuration with the memory blocks in at least one of the flash memory zones 310-1 to 310-N. In some embodiments, the 1:1 mapping to the memory blocks may be performed during manufacturing or during an initial use of the memory system 300. Thus, when initially writing data to the flash memory zones 310-1 to 310-N, the flash memory controller 320 may identify memory blocks to store data by linearly sequencing through the logical-to-physical table 330.

After the initialization of the logical-to-physical table 330 or when the flash memory controller 320 completes the linear sequencing through the logical-to-physical table 330, the flash memory controller 320 is required to identify for pointers to erased or erasable memory blocks in the flash memory zones 310-1 to 310-N during data write operations. Since searching the logical-to-physical table 330 may be an inefficient and onerous task for the flash memory controller 320, embodiments of the memory system 300 include a wear-leveling table 340 populated with pointers to unallocated memory blocks in one or more of the flash memory zones 310-1 to 310-N. The wear-leveling table 340 may be located in a redundant area of the flash memory and/or stored in another memory, e.g., a random access memory (RAM) or the like, included in the memory system 300.

The flash memory controller 320 includes a wear-leveling unit 325 to populate the wear-leveling table 340 with the pointers to the unallocated memory blocks in one or more of the flash memory zones 310-1 to 310-N. In some embodiments, the wear-leveling unit 325 may populate the wear-leveling table 340 according to wear-leveling table data from the flash memory zones 310-1 to 310-N. The wear-leveling table data may be the pointers to the unallocated memory blocks in a corresponding flash memory zone 310-1 to 310-N. The wear-leveling unit 325 populates the wear-leveling table 340 with pointers to the unallocated memory blocks after the or concurrently to the initialization of the logical-to-physical table 330, and/or after or concurrently with the flash memory controller 320 storing data to memory blocks corresponding to the initialized pointers in the logical-to-physical table 330.

The wear-leveling unit 325 may implement a prioritization scheme that prioritizes the wear-leveling table 340, for example, during the population of the wear-leveling table 340. The wear-leveling unit 325 may prioritize the unallocated memory blocks, or the erased or erasable memory blocks, according to the number of write operations each memory block has undergone or according to when the memory blocks were erased or deemed erasable. The prioritization of the wear-leveling table 140 may allow the wear-leveling unit 325 to linearly access pointers to erased or erasable memory blocks according to their priority, thus allowing the memory system 300 to more evenly distribute write operations among the memory blocks and helping to elongate the life of the flash memory zones 310-1 to 310-N.

When the flash memory controller 320 determines to write data to one of the flash memory zones, for example flash memory zone 310-1, the wear-leveling unit 325 may identify whether pointers stored in the wear-leveling table 340 corresponds to the flash memory zone 310-1. When the pointers stored in the wear-leveling table 340 correspond to flash memory zone 310-1, the wear-leveling unit 325 may access the wear-leveling table 340 to identify at least one erased or erasable memory block in the flash memory, zones 310-1 to 310-N available to store the data.

When wear-leveling table 340 is populated with pointers to that do not correspond to the flash memory zone 310-1, the wear-leveling unit 325 may populate the wear-leveling table 340 with pointers to the flash memory zone 310-1. For instance, the wear-leveling unit 325 may populate the wear-leveling table 340 with wear-leveling table data stored in a redundant area of flash memory zone 310-1. In some embodiments, the flash memory controller 320 may store the pointers stored in the wear-leveling table 340 to a redundant area of their corresponding flash memory zone 310-2 to 310-N prior to populating the wear-leveling table 340 with pointers corresponding to the flash memory zone 310-1.

Figure 4:
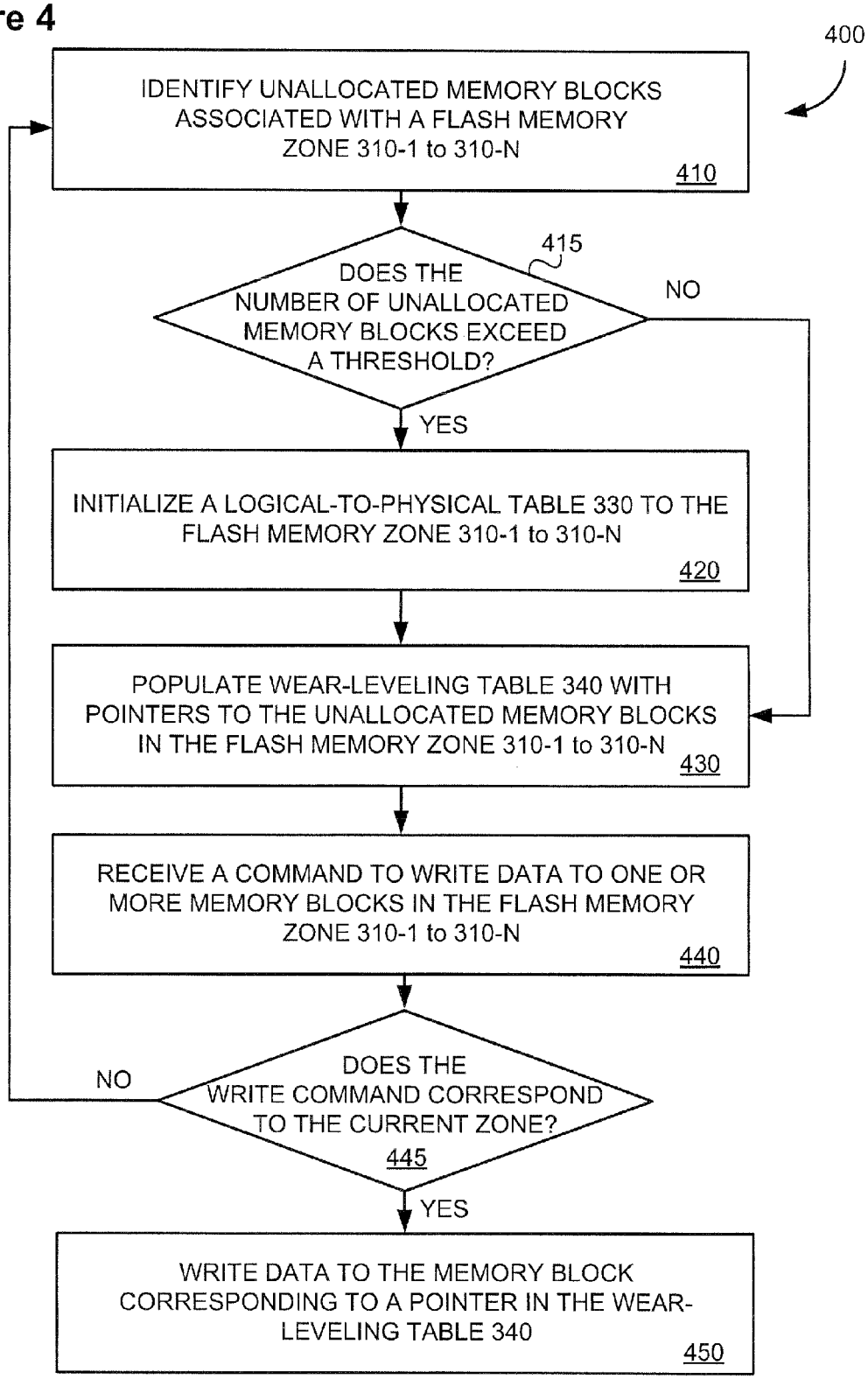
FIG. 4 shows a flowchart illustrating example operations of the memory system shown in FIG. 3.

FIG. 4 shows a flowchart 400 illustrating example operations of the memory system shown in FIG. 3. Referring to FIG. 4, in a block 410, the flash memory controller 320 identifies unallocated memory blocks associated with one of the flash memory zones 310-1 to 310-N. The flash memory controller 320 may identify the unallocated memory blocks according to wear-leveling table data associated with the flash memory zone.

In a decision block 415, the flash memory controller 320 determines whether the number of identified unallocated memory blocks exceeds a threshold. The threshold may be preset in the flash memory controller 320 or dynamically determined. The threshold may correspond to a number of entries in the wear-leveling table and/or may indicate to the flash memory controller 320 whether the logical-to-physical table 330 has been initialized.

When the number of identified unallocated memory blocks exceeds the threshold, the flash memory controller 320, in a block 420, initializes a logical-to-physical table 330 for the flash memory zone 310-1 to 310-N. The initialization of the logical-to-physical table 330 may include linearly accessing the pointers of the logical-to-physical table 330 prior to accessing the wear-leveling table 340. When the number of identified unallocated memory blocks does not exceed the threshold, execution proceeds to block 430.

In a block 430, the flash memory controller 320 populates the wear-leveling table 340 with pointers to the identified memory blocks in the flash memory zone 310-1 to 310-N. In a block 440, the flash memory controller 320 receives a command to write data to one or more memory blocks in the flash memory zone 310-1 to 310-N. The command may indicate a flash memory zone 310-1 to 310-N to store the data.

In a decision block 445, the flash memory controller 320 determines whether the write command corresponds to the current flash memory zone 310-1 to 310-N. When the write command corresponds to the current flash memory zone 310-1 to 310-N, the flash memory controller 320, in a block 450, writes the data to the memory block corresponding to a pointer in the wear-leveling table 340.

When the command does not correspond to the current flash memory zone 310-1 to 310-N, execution returns to block 410, where the flash memory controller 320 identifies unallocated memory blocks associated with the flash memory zone 310-1 to 310-N identified by the write command. In some embodiments, the pointers in the wear-leveling table 340 may be stored to an associated flash memory zone 310-1 to 310-N prior to the re-execution of block 410.

One of skill in the art will recognize that the concepts taught herein can be tailored to a particular application in many other advantageous ways. In particular, those skilled in the art will recognize that the illustrated embodiments are but one of many alternative implementations that will become apparent upon reading this disclosure.

The preceding embodiments are exemplary. Although the specification may refer to "an", "one", "another", or "some" embodiment(s) in several locations, this does not necessarily mean that each such reference is to the same embodiment(s), or that the feature only applies to a single embodiment.

The invention claimed is:

1. A method comprising:
   populating a wear-leveling table with pointers to one or more memory blocks in a flash memory, where the pointers are associated with erased memory blocks or memory blocks that are faulty;

identifying at least one pointer in the wear-leveling table associated with an erased memory block;

storing data to the memory block associated with the identified pointer;

identifying erased memory blocks and faulty memory blocks in the flash memory;

comparing a number of identified erased memory blocks and faulty memory blocks to a threshold; and populating the wear-leveling table responsive to the comparing or initializing the flash memory with pointers to the memory blocks responsive to the comparing.

2. The method of claim 1 includes erasing data stored in one or more of the memory blocks responsive to the identifying at least one pointer in the wear-leveling table and prior to storing data to the memory block associated with the identified pointer.

3. The method of claim 1 includes prioritizing the pointers in the wear-leveling table according to when the memory blocks associated with the pointers were erased.

4. The method of claim 3 includes accessing the wear-leveling table for pointers according to the prioritizing.

5. The method of claim 1 includes prioritizing the pointers in the wear-leveling table according to the number of write operations performed on the memory blocks associated with the pointers.

6. The method of claim 1 includes initializing a logical-to-physical table with pointers to the memory blocks in the flash memory concurrently to populating the wear-leveling table with pointers associated with the erased memory blocks.

7. The method of claim 6 includes allocating the memory blocks associated with the pointers in the logical-to-physical table prior to accessing the wear-leveling table for pointers to erased memory blocks.

8. A method comprising:

populating a wear-leveling table with pointers to one or more memory blocks in a flash memory, where the pointers are associated with erased memory blocks or memory blocks that are faulty;

receiving a write command identifying a zone of the flash memory to store data;

determining the wear-leveling table does not correspond to the identified zone;

re-populating the wear-leveling table with pointers to memory blocks corresponding to the identified zone;

identifying at least one pointer in the re-populated wear-leveling table associated with an erased memory block; and storing data to the memory block associated with the identified pointer.

9. The method of claim 8, comprising:

identifying erased memory blocks and faulty memory blocks in the flash memory;

comparing a number of identified erased memory blocks and faulty memory blocks to a threshold; and populating the wear-leveling table responsive to the comparing.

10. The method of claim 8, comprising:

identifying erased memory blocks and faulty memory blocks in the flash memory;

comparing a number of identified erased memory blocks and faulty memory blocks to a threshold; and initializing the flash memory with pointers to the memory blocks responsive to the comparing.

\* \* \* \* \*